(12) United States Patent
Kim et al.

(10) Patent No.: US 7,422,366 B1
(45) Date of Patent: Sep. 9, 2008

(54) CURRENT MIRROR METHODOLOGY QUANTIFYING TIME DEPENDENT THERMAL INSTABILITY ACCURATELY IN SOI BJT CIRCUITRY

(75) Inventors: Jonggook Kim, San Jose, CA (US); Yun Liu, Sunnyvale, CA (US); Joseph A De Santis, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 596 days.

(21) Appl. No.: 10/939,006

(22) Filed: Sep. 10, 2004

(51) Int. Cl.
*G01K 7/01* (2006.01)

(52) U.S. Cl. .................... 374/178; 324/765; 374/1; 702/99

(58) Field of Classification Search ......... 374/170–173, 374/178, 1; 702/99, 130–135; 324/765; 327/512, 513
See application file for complete search history.

(56) References Cited

U.S. PATENT DOCUMENTS

| | | | | |
|---|---|---|---|---|
| 4,669,026 A | * | 5/1987 | Widlar | 361/103 |
| 5,502,399 A | * | 3/1996 | Imai | 324/765 |
| 5,521,490 A | * | 5/1996 | Manohar | 323/315 |
| 5,619,430 A | * | 4/1997 | Nolan et al. | 702/63 |
| 5,654,896 A | * | 8/1997 | Ochi | 716/4 |
| 6,043,714 A | * | 3/2000 | Yamamoto et al. | 330/296 |
| 6,304,129 B1 | * | 10/2001 | Blair et al. | 327/378 |
| 6,529,066 B1 | * | 3/2003 | Guenot et al. | 327/539 |
| 6,807,042 B2 | * | 10/2004 | Spampinato et al. | 361/103 |
| 6,811,309 B1 | * | 11/2004 | Ravishanker | 374/178 |
| 7,015,745 B1 | * | 3/2006 | Burinskiy et al. | 327/543 |

FOREIGN PATENT DOCUMENTS

JP          10135403 A  *  5/1998

OTHER PUBLICATIONS

Shaikh F. Shams et al., Motorola, Inc. "SiGe HBT Self-Heating Modeling and Characterization from AC Data", IEEE BCTM 5.2, pp. 92-95, no date.

* cited by examiner

*Primary Examiner*—Gail Verbitsky
(74) *Attorney, Agent, or Firm*—Stallman & Pollock LLP

(57) ABSTRACT

A current mirror method is provided that can be utilized to evaluate thermal issues is silicon-on-insulator (SOI) bipolar junction transistors (BJTs). The method significantly improves safe operating area (SOA) measurement sensitivity. Unlike conventional methods, the current mirror method can provide quantitative analysis of the BJTs thermal instability over a wide power range, even in the apparent SOA of the device. This method can also predict and evaluate SOA with respect to emitter ballast resistance and current crowding.

1 Claim, 10 Drawing Sheets

US 7,422,366 B1

CURRENT MIRROR METHODOLOGY QUANTIFYING TIME DEPENDENT THERMAL INSTABILITY ACCURATELY IN SOI BJT CIRCUITRY

TECHNICAL FIELD

The present invention relates to a methodology for extracting a thermal time constant and thermal capacitance in a silicon-on-insulator (SOI) power bipolar junction transistor (BJT).

BACKGROUND OF THE INVENTION

Silicon-on-insulator (SOI) bipolar junction transistors (BJTs) are used in high speed applications because of their improved packing density due to reduced parasitic capacitance effects. However, compared to conventional bulk silicon BJTs, SOI BJTs exhibit heat dissipation issues because of the high thermal resistance associated with the trench isolation and buried oxides surrounding the transistor.

In high performance SOI BJTs, thermal instability at high currents and voltages is a primary reliability concern. From the reliability point of view, thermal issues are mitigated by defining the safe operating area (SOA) based upon the power dissipation capability of the device.

Traditionally, the SOA of a power BJT has been determined using a discrete transistor in a fixed single measurement mode, i.e., a voltage ($V_{BE}$) controlled mode or a current ($I_{BE}$) mode. In the voltage-control measurement mode, the BJT exhibits a destructive thermal runaway mode whereby temperature rise increases device current causing an abrupt decrease in Beta at a particular $V_{BE}$, as shown in FIG. 1. FIG. 1 also shows that at a critical $V_{BE}$ (>0.8V), current increases induce a rise in temperature that further increases current leading to destructive thermal runaway. In the voltage control method, the device's SOA is determined by the $V_{BE}$ and $J_E$ (emitter current density) that result in thermal runaway. $V_{BE}$ and $J_E$ decrease as $V_{CE}$ increases.

In the current controlled mode for determining BJT SOA, increases in emitter current ($I_E$) cause a decrease in $V_{BE}$, indicative of a negative device resistance region. This negative resistance region occurs at high applied power, as shown in FIG. 2. However, the transistor typically remains undamaged during fixed current measurements since there is no spontaneous feedback between temperature and current. In the emitter current controlled method, the device's SOA is determined by the $V_{BE}$ and $J_E$ that result in negative resistance. As in the case of the voltage control method, $V_{BE}$ and $J_E$ decrease as $V_{CE}$ increases.

As discussed above, the standard SOA extraction methods use the same current density onset of thermal runaway and the negative resistance with $V_{CE}$ bias to determine the SOA, as shown in FIG. 3. This SOA, however, merely indicates the onset of the device's thermal runaway or negative resistance regime, but does not assure that the BJT in steady-state is in a thermally stable operating region. For example, at the operating point P in FIG. 3, with an applied $J_E$ of 100 µA/µm² and a $V_{CE}$ of 8V, the BJT does not display negative resistance at high current but deviates significantly from the low $V_C$ curve in FIG. 2. A temperature rise at operating point P results in a decrease of $V_{BE}$ by 0.04V from point A and an increase of $I_C$ by 2.5 mA, which is greater than 100% increase in $I_C$ (~1.5 mA) at point B in FIG. 3.

SUMMARY OF THE INVENTION

The present invention provides a current mirror method that can be used to evaluate thermal issues in silicon-on-insulator (SOI) bipolar junction transistors (BJTs). Compared to conventional transistor level techniques, the method of the present invention significantly improves safe operating area (SOA) measurement sensitivity. Unlike conventional techniques, the current mirror method provides quantitative analysis of the BJTs thermal instability over a wide power range, even in the apparent SOA of the device. The method can predict and evaluate SOA with respect to emitter ballast resistance and current crowding.

The features and advantages of the present invention will be more fully appreciated upon consideration of the following detailed description of the invention and the accompanying drawings that set forth an illustrative embodiment in which the principles of the invention are utilized.

DESCRIPTION OF THE INVENTION

Figure 1:
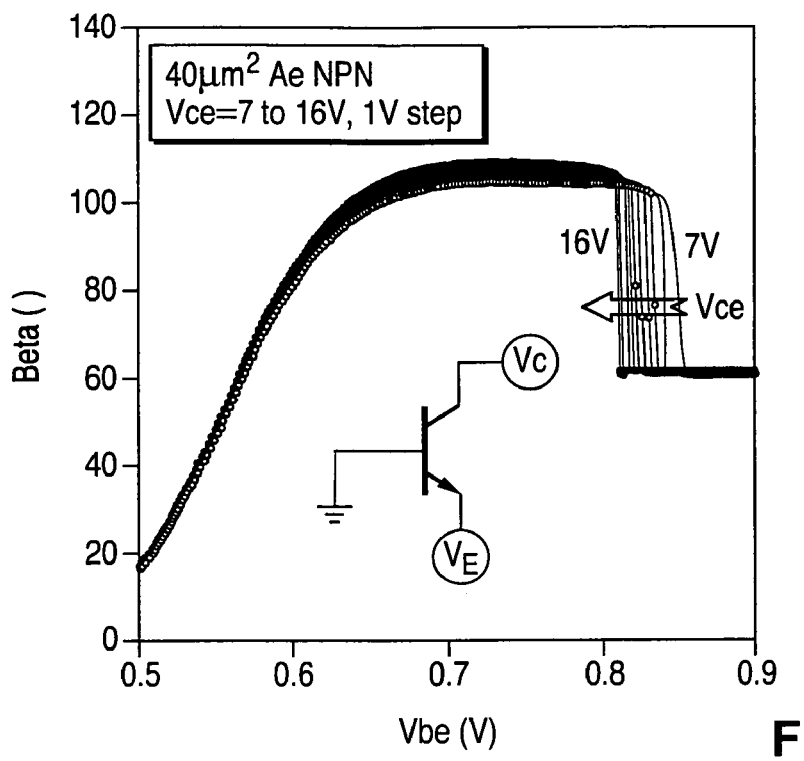
FIG. 1 is a graph showing thermal runaway as a function of $V_{CE}$ bias in the voltage ($V_{BE}$) controlled mode.
Figure 2:
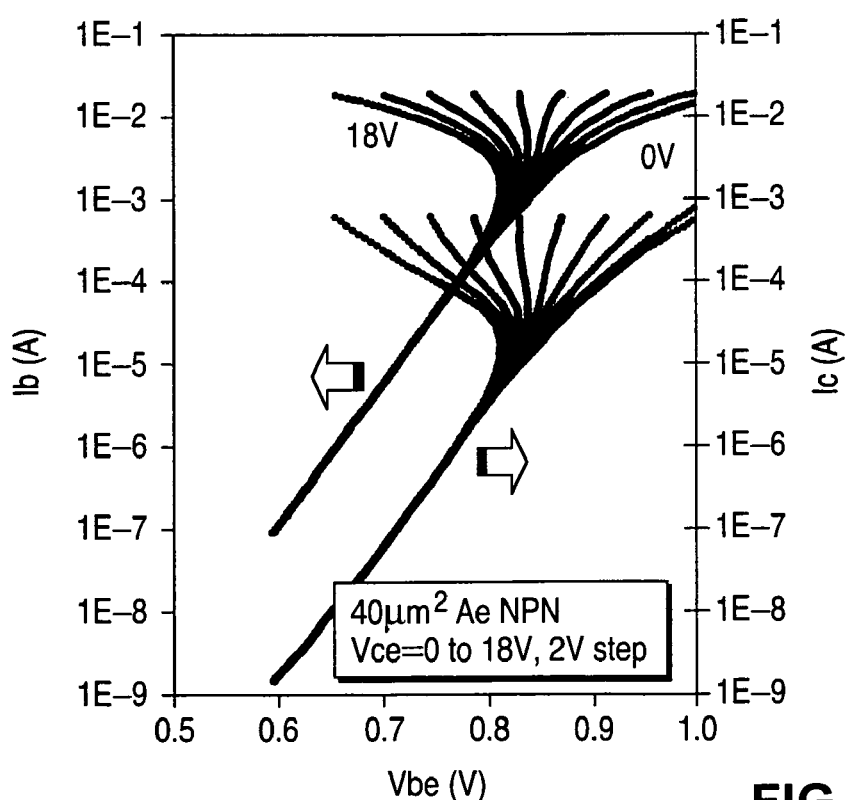
FIG. 2 is a graph showing negative resistance as a function of $V_{CE}$ bias in the current ($I_E$) controlled mode.
Figure 3:
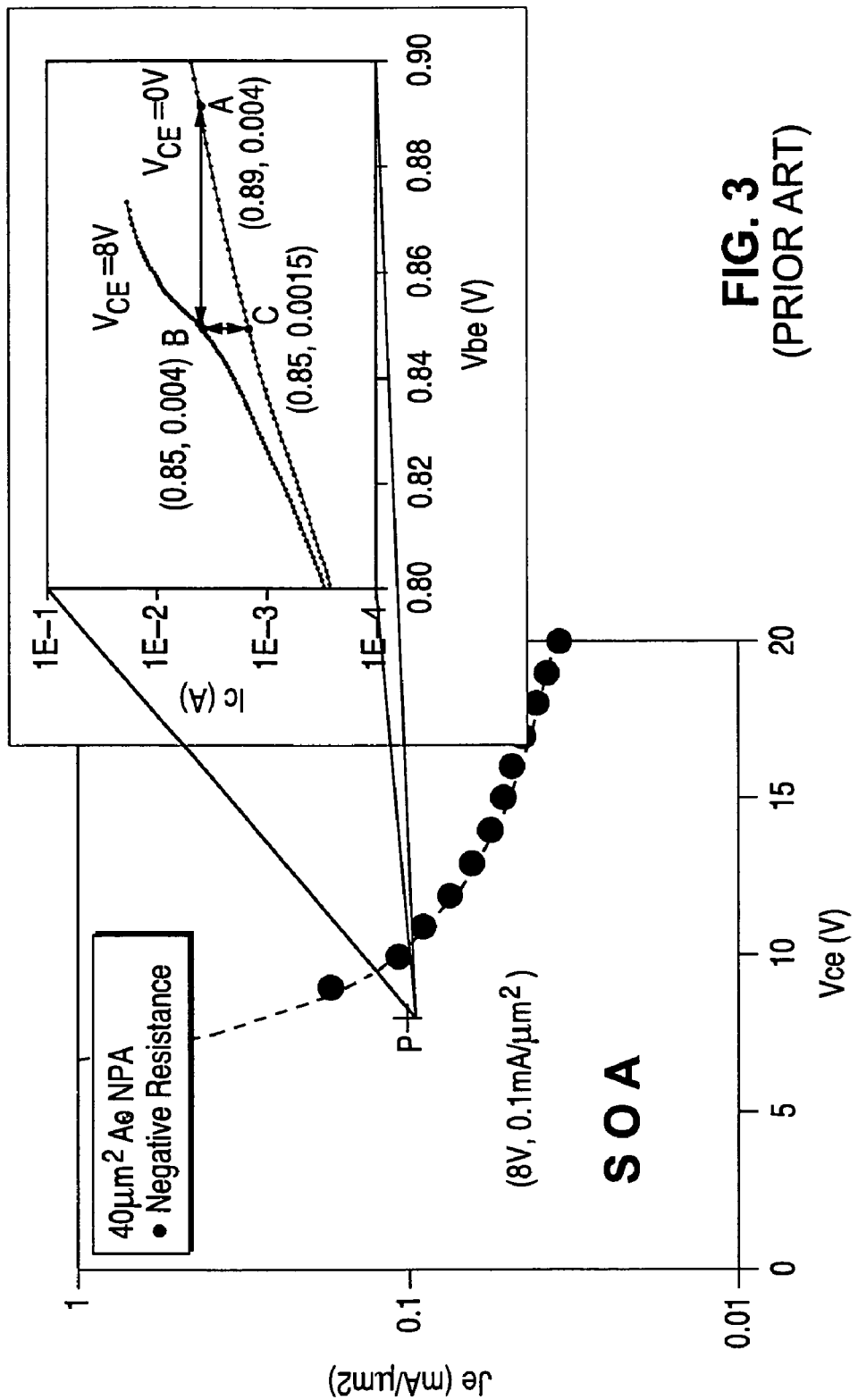
FIG. 3 is a graph showing BJT safe operating area as determined by negative resistance.
Figure 4:
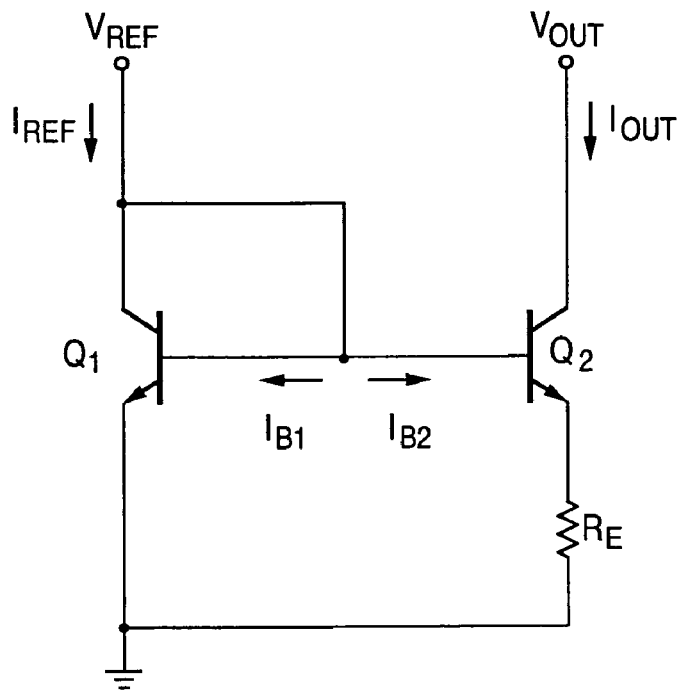
FIG. 4 shows a simple current mirror with reference ($A_E$=5 µm²) and power ($A_E$=40 µm²) transistors.

In actual circuit operation significant thermal issues can occur for an SOI BJT power transistor used as an output buffer with a current mirror. The current mirror thermally de-couples its two transistors, the small (or reference) one and large (power) one at high current. In order to investigate the temperature dependence of the current mirror shown in FIG. 4, the mirror ratio of $Q_1$ and $Q_2$ is defined as $$MR(MirrorRatio) \equiv \frac{I_{OUT}}{I_{REF}} \quad (1)$$

where $I_{REF} = \beta_1 \cdot I_{B1} + I_{B1} + I_{B2}$ and $I_{OUT} = \beta_2 \cdot I_{B2}$.

Assuming $\beta = \beta_1 = \beta_2$, the mirror ratio becomes $$MR = \frac{I_{B2}}{I_{B1}} \cdot \frac{\beta}{\beta + 1 + \frac{I_{B2}}{I_{B1}}}, \quad (2)$$

where $$\frac{I_{B2}}{I_{B1}} \approx AR \cdot \left(1 + \frac{\Delta T}{T}\right)^m \cdot \exp\left[\left(\frac{qV_{BE}}{kT}\right) \cdot \left(\frac{\frac{\Delta T}{T}}{1 + \frac{\Delta T}{T}}\right)\right] \quad (3)$$

and AR is the area ratio and m is the saturation current temperature exponent. It can be seen from Equations (2) and (3) that if $\Delta T=0$, then the $I_{B2}/I_{B1}$ ration is equal to AR; and if $I_{B2}/I_{B1} << \beta$, then $MR \approx AR$.

Figure 5:
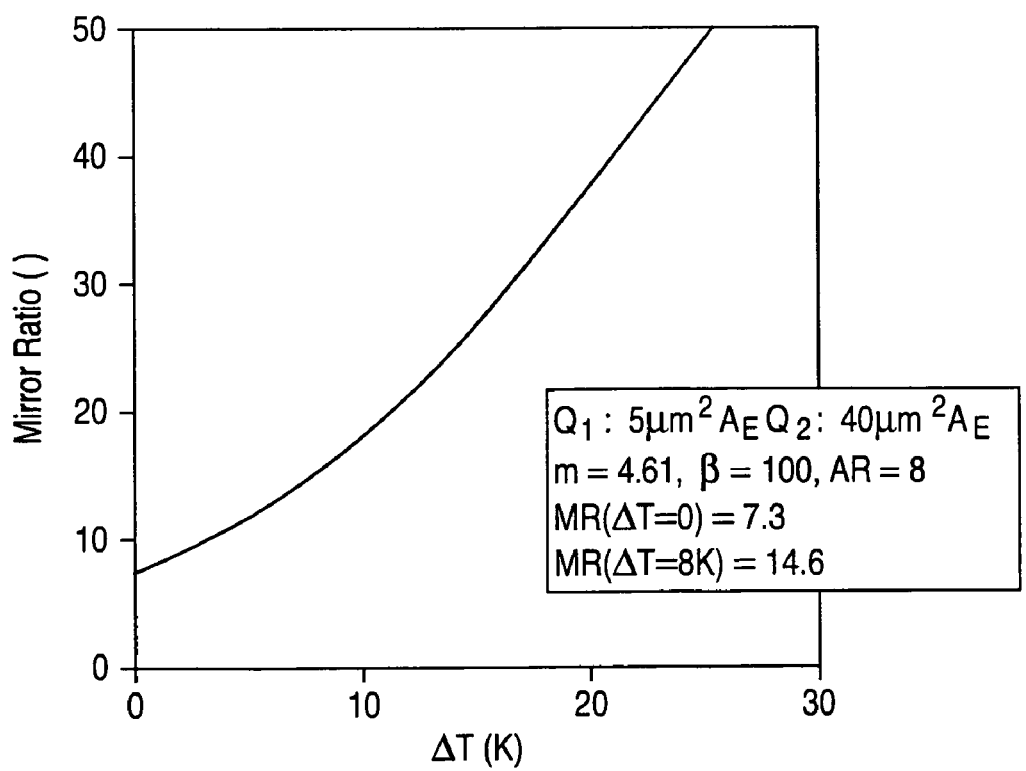
FIG. 5 is a graph showing increase in mirror ration with respect to temperature mismatch calculated using Equation (2).

FIG. 5 demonstrates that the mirror ratio can be greatly affected by a temperature rise in the power transistor. FIG. 5 results were calculated for the transistors $Q_1$ and $Q_2$ in FIG. 4 using Equations (2) and (3) with m=4.61 $\beta$=100, AR=8. FIG. 5 shows that the mirror ratio doubles from 7.3 to 14.6 for a $Q_2$ temperature increase of 8 K. Therefore, temperature mismatch is a primary design concern in a thermally de-coupled SOI current mirror.

Figure 6:
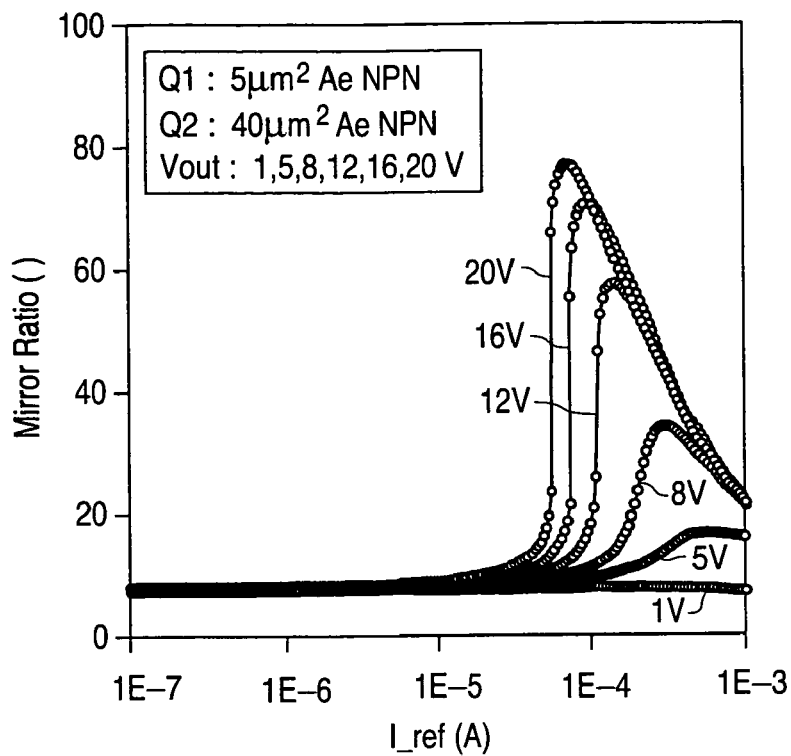
FIG. 6 is a graph showing the effect of $V_{CE}$ on self-heating effects as determined by the current mirror ratio method in accordance with the invention.

The steady state self-heating effect in a simple current mirror is characterized by an increase in the mirror at different output bias ($V_{OUT}$) as shown in FIG. 6. As seen in FIG. 6, at a reference voltage of 1 V, there is no temperature increase in the power transistor relative to the reference device and the mirror ratio stays constant and is equal to the area ratio over the entire current range. However, at higher $V_{OUT}$ self-heating effects are accompanied by an increase in the mirror ratio and a reduction of the onset $I_{REF}$.

Compared to the conventional individual transistor methods discussed previously, the current mirror method displays two distinct regimes at low (<~5 V) and high (>12 V) $V_{CE}$ bias.

First, it is difficult to quantify self-heating effects at low bias using conventional methods since the device does not display negative resistance in the current controlled mode or an abrupt Beta drop in the voltage controlled mode even if changes occur in Beta or $V_{BE}$ at low bias. On the other hand, the current mirror method can easily determine self-heating effects as seen by an increase in the mirror ratio. For example, at a $V_{OUT}$ of 5 V in FIG. 6, the current mirror ratio increases by 100% at an 1 REF of 400 μA.

Second, the power transistor in the current mirror is not controlled by a single fixed mode current or voltage at the onset of the self-heating range. When $I_{REF}$ approaches the onset of self-heating, both the power transistor's base current and voltage change simultaneously, especially at high bias ($V_{OUT}$>12 V in FIG. 6), causing an abrupt increase in the mirror ratio. This abrupt change is the result of thermal runaway in the voltage-controlled mode. If circuit feedback is considered the transistor-level single fixed bias or current mode methods of measuring SOA may not be applicable.

Figure 7:
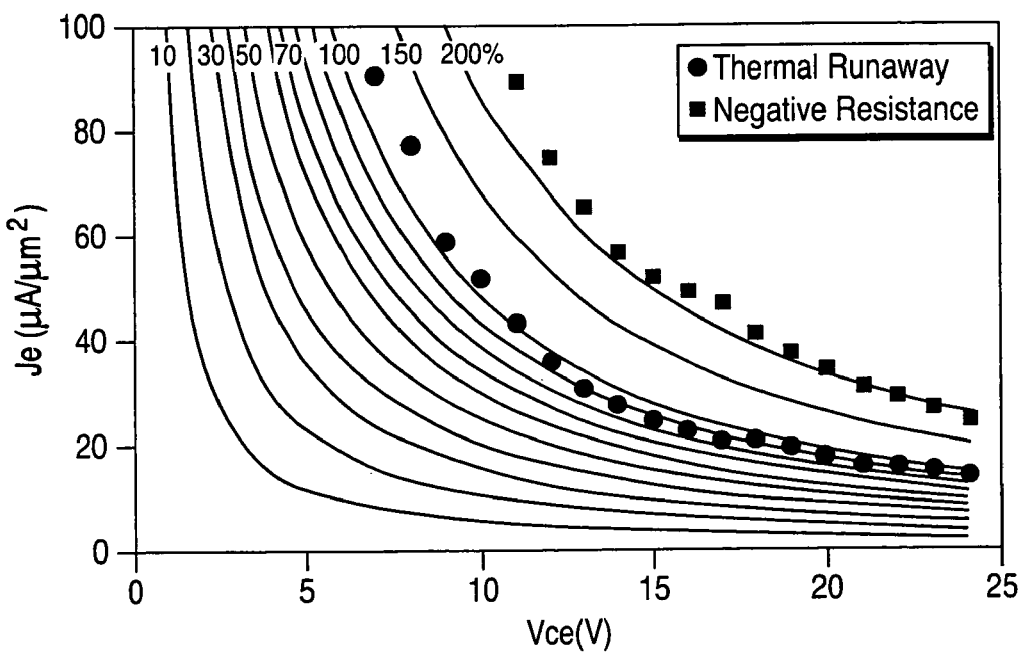
FIG. 7 is a graph showing BJT safe operating area as determined by contours of increasing current mirror ratios.

FIG. 7 shows that the BJT SOA can be described by contours of increasing mirror ratios. As power increases, the mirror ratio gradually increases to 200% at the onset of the negative resistance regime, and then abruptly increases to values well over 200%. Therefore, the increase in the current mirror ratio provides important information to the designer even at low power. The data in FIG. 7 demonstrates that BJT thermal instability does not occur instantaneously at a certain bias condition, but increases continuously with applied power.

Unlike the MOSFET, the time dependent self-heating effect in BJTs has not been well characterized. S-parameter measurement methods include thermal parameters such as thermal time constant and capacitance. However, because of the complexity of S-parameter self-heating model and additional parasitic parameters, it is difficult to account for the effect of the temperature and current increases in BJTs. The current mirror method is provides a technique for monitoring both time dependent and steady state self-heating effects.

Figure 8:
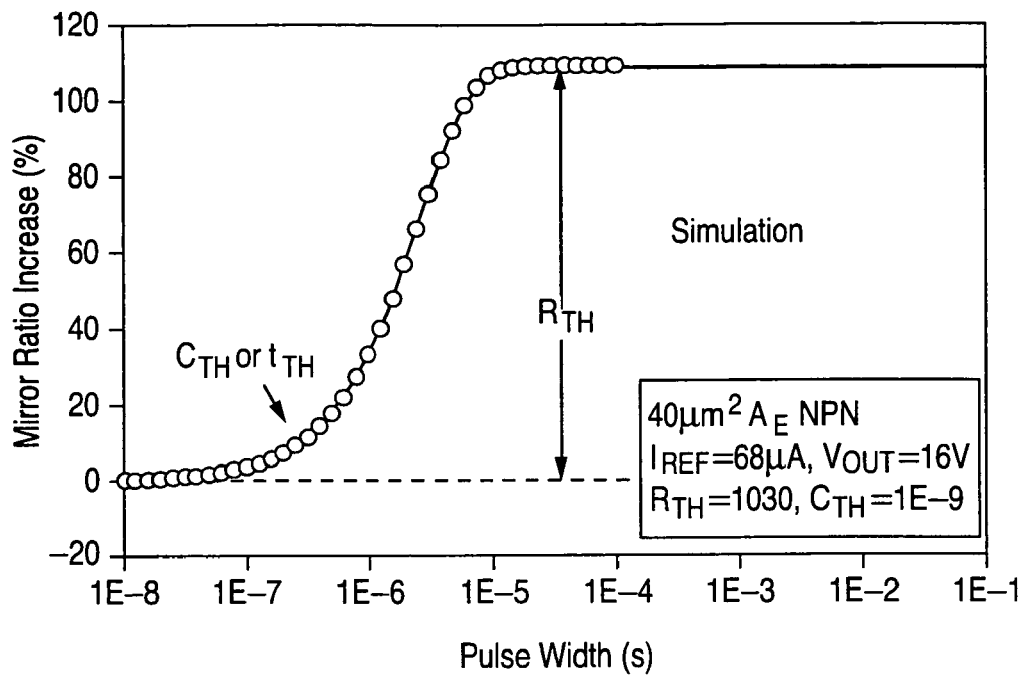
FIG. 8 is a graph showing simulated mirror ratio increase with respect to transient pulse width.

The simulation results provided in FIG. 8 show the effect of a transient pulse on the current mirror ratio. The mirror ratio initially increases as the pulse width increases (lower frequency) and becomes constant when the transient time approaches the thermal time constant. At low frequency, the mirror ratio saturates at a certain value that is a function of the thermal resistance determined at steady state conditions. The current mirror, therefore, can provide a practical method of determining thermal parameters such as thermal resistance and capacitance.

Figure 9:
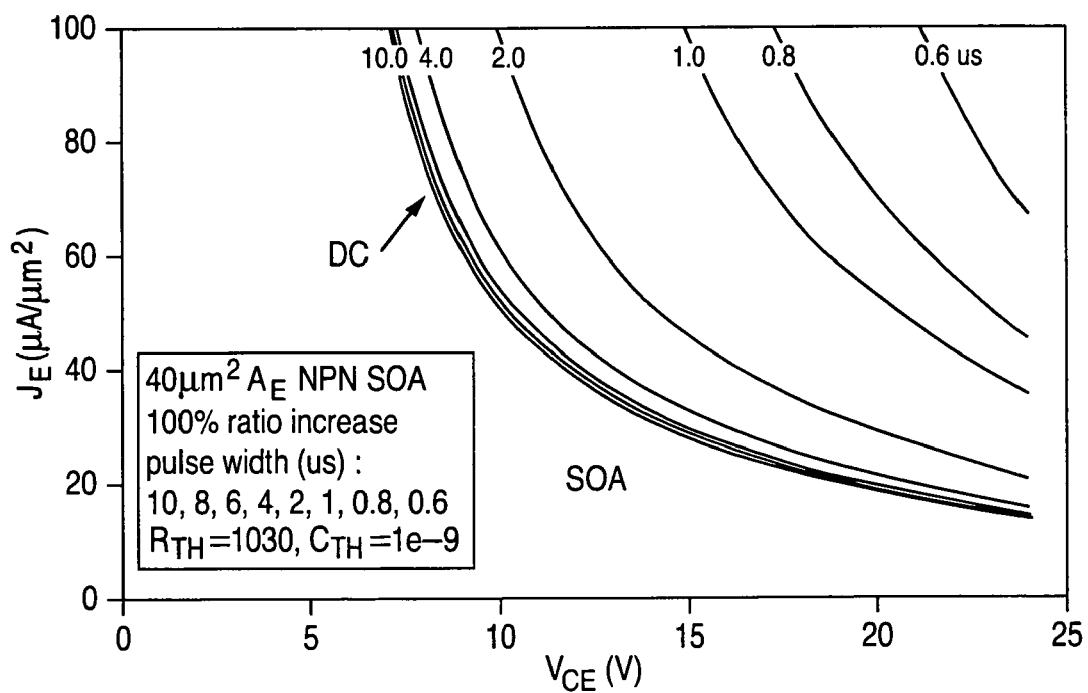
FIG. 9 is a graph showing safe operating area (100% mirror ratio increase) versus transient pulse width.

The time dependence of SOA as determined by a 100% mirror ratio increase is shown in FIG. 9. Combining FIG. 7 with the steady state SOA FIG. 9 shows that the SOA is determined by frequency ranges close to the thermal time constant.

Figure 10:
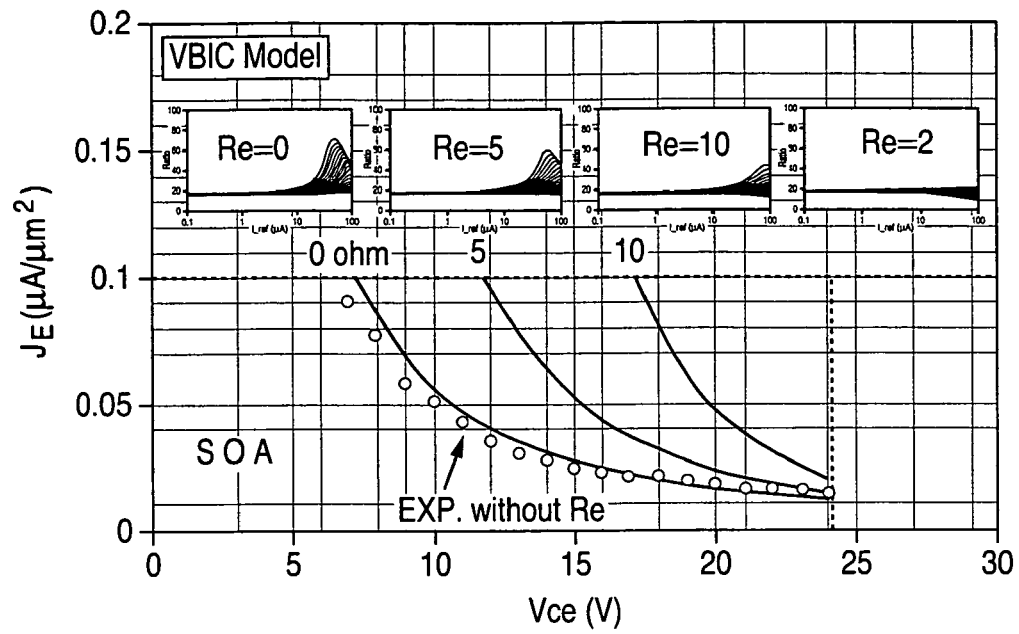
FIG. 10 shows the SPICE simulated effect of increased emitter ballast resistor value on the BJT as determined using a Vertical Bipolar Inter-Company (VBIC) model.

Traditionally, circuit designers minimize self-heating effects by adding an emitter ballast resistor ($R_E$). $R_E$ compensates for the $V_{BE}$ drop and extends the SOA. FIG. 10 shows simulated BJT SOA as a function of $R_E$. The simulation shows that an $R_E$ OF 20Ω at 24 V, and $R_E$ OF 5Ω at 10 V or an $R_E$ of 10Ω at 16 V is required to completely compensate for the temperature rise in the power BJT.

Figure 11:
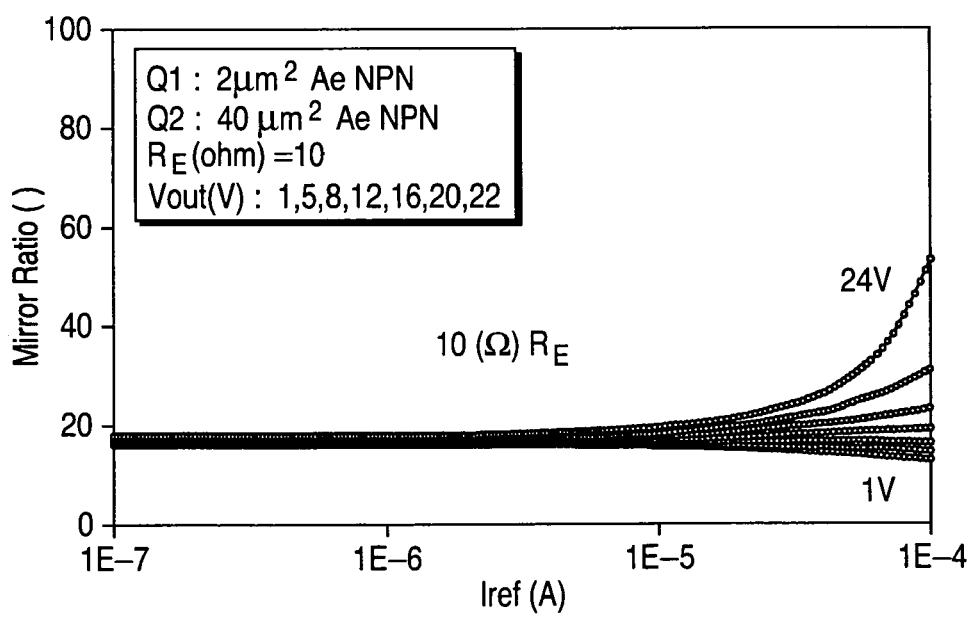
FIG. 11 is a graph showing current mirror results with an $R_E$ of 10 Ω.

FIG. 11 displays current mirror experiments with an $R_E$ of 10Ω. In this case, the power transistor is not affected by self-heating until $V_{out}$ exceeds 16 V. Unfortunately, adding an emitter resistor reduces the current drive capability of the power transistor at low $V_{OUT}$ (<5 V).

Figure 12:
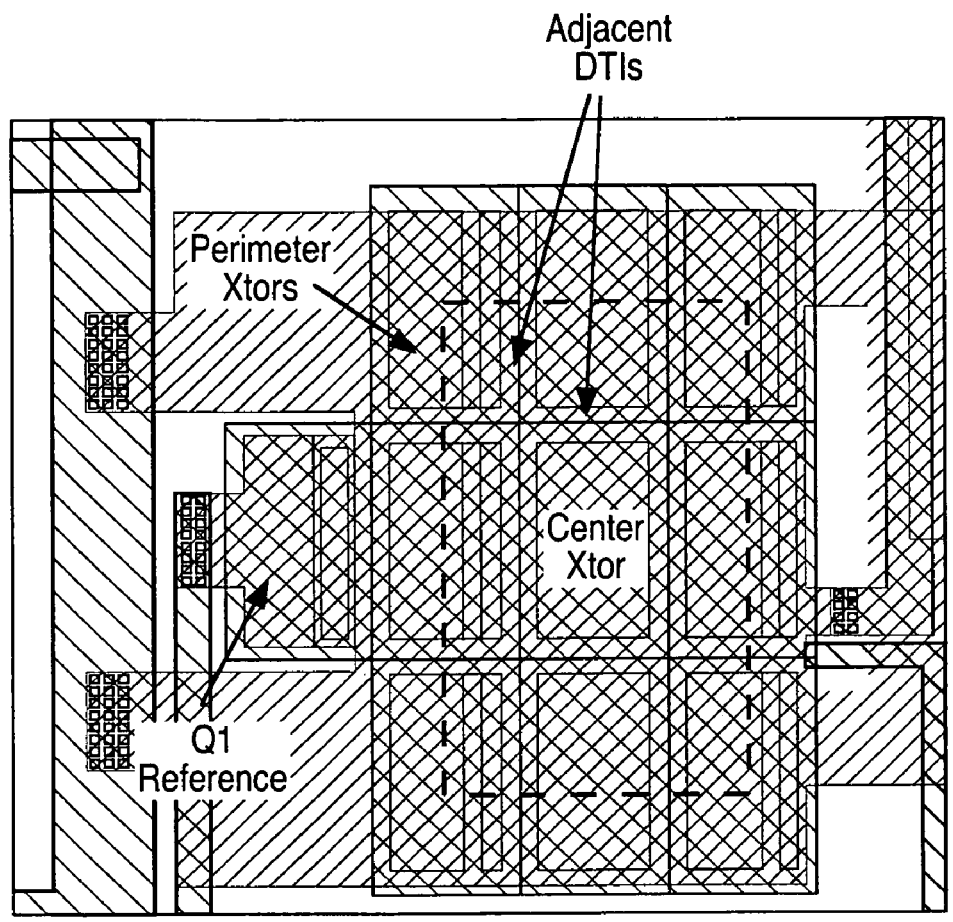
FIG. 12 shows a 3×3 output current mirror BJT with internal adjacent deep trench isolation (DTI).
Figure 13A:
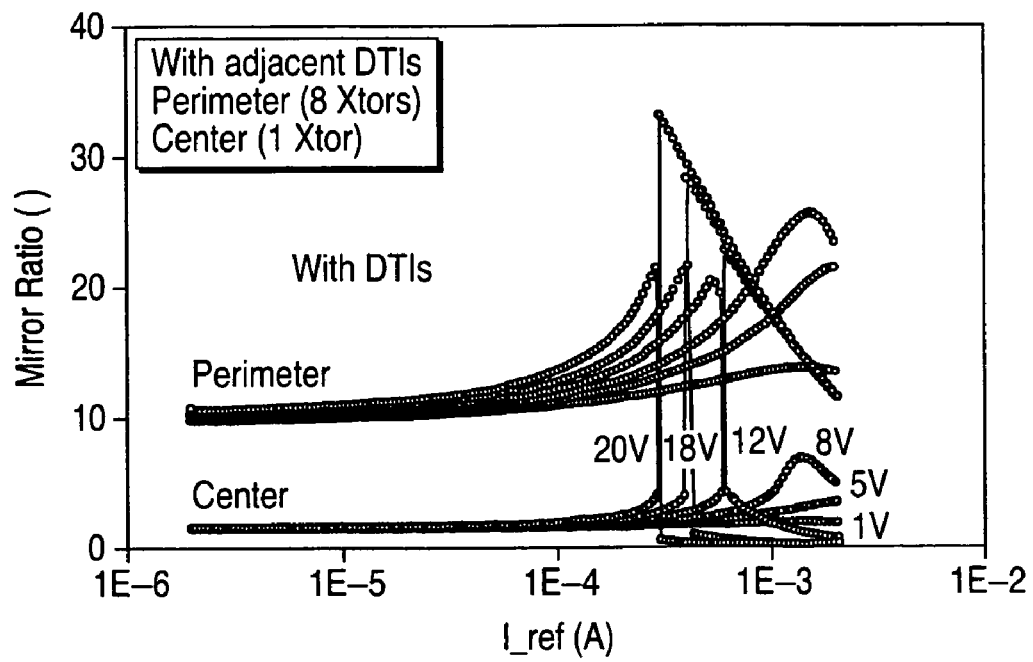
FIGS. 13A and 13B are graphs showing center transistor current crowding with and without adjacent deep trench isolation (DTI), respectively.
Figure 13B:
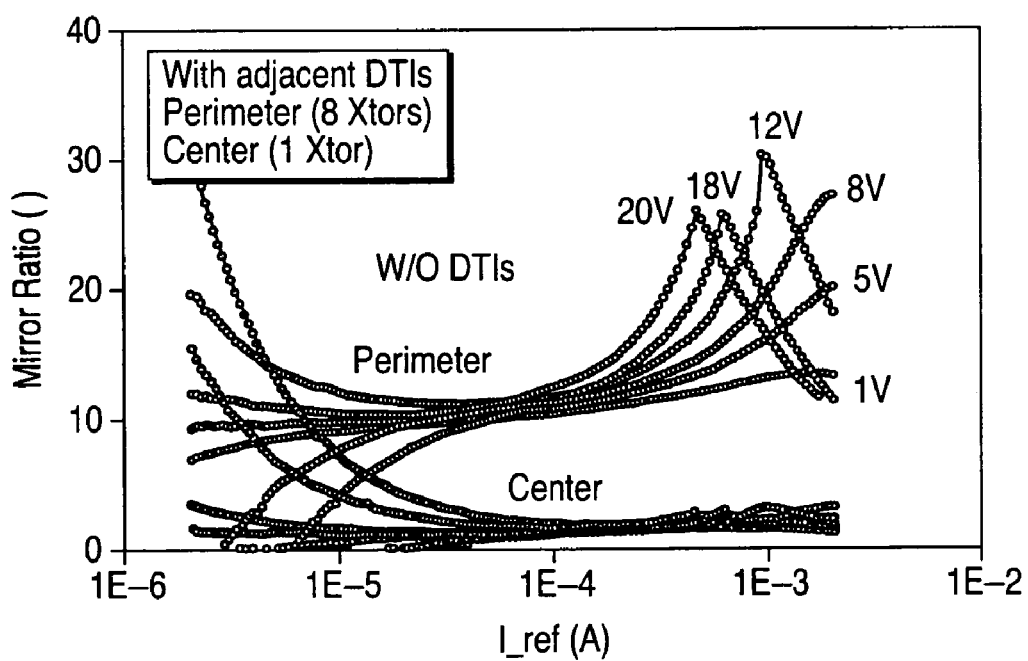

Anther application of the current mirror method is to characterize current crowding in output power transistors arrays. For the 3×3 output BJT shown in FIG. 12, output current crowding occurs for the center transistor when $V_{OUT}$ exceeds 12 V. This current crowding is caused by adjacent deep trench isolation (DTI) as seen by comparing FIG. 13A with DTI to FIG. 13B without DTI.

Figure 14:
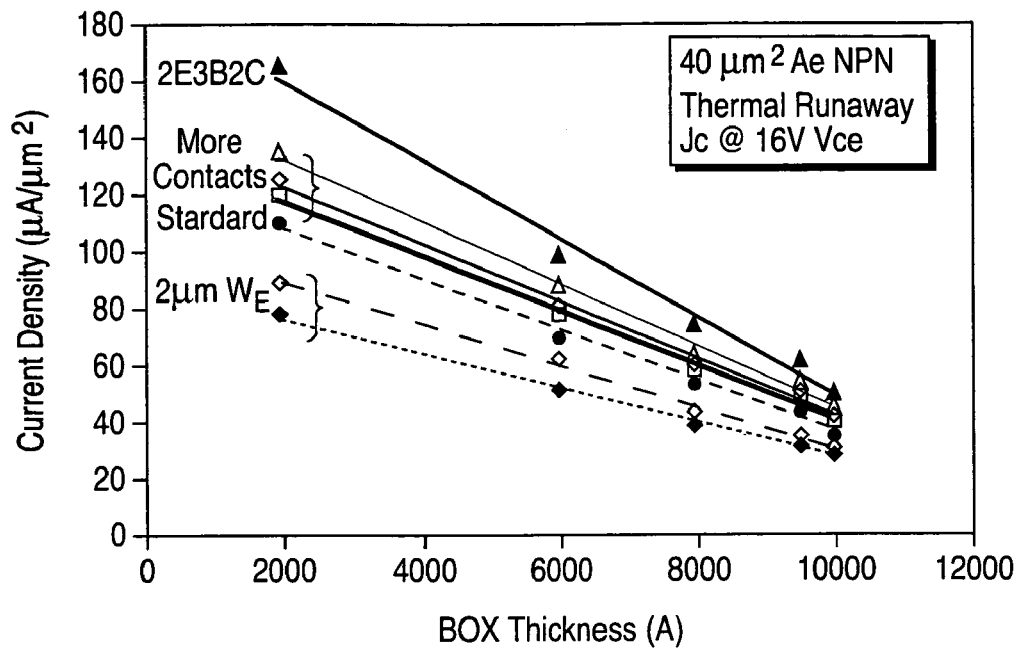
FIG. 14 is a graph showing the effect of process and layout on the thermal instability of a power SOI BJT.

The self-heating of a power SOI BJTs under steady state is controlled by the thermal resistance ($R_{TH}$) defined by the process and layout. FIG. 14 shows that the critical current density for a 100% increase in mirror ratio is a linear function of buried oxide (BOX) thickness. FIG. 14 also shows that the sensitivity to layout is more important at small BOX thickness.

Figure 15:
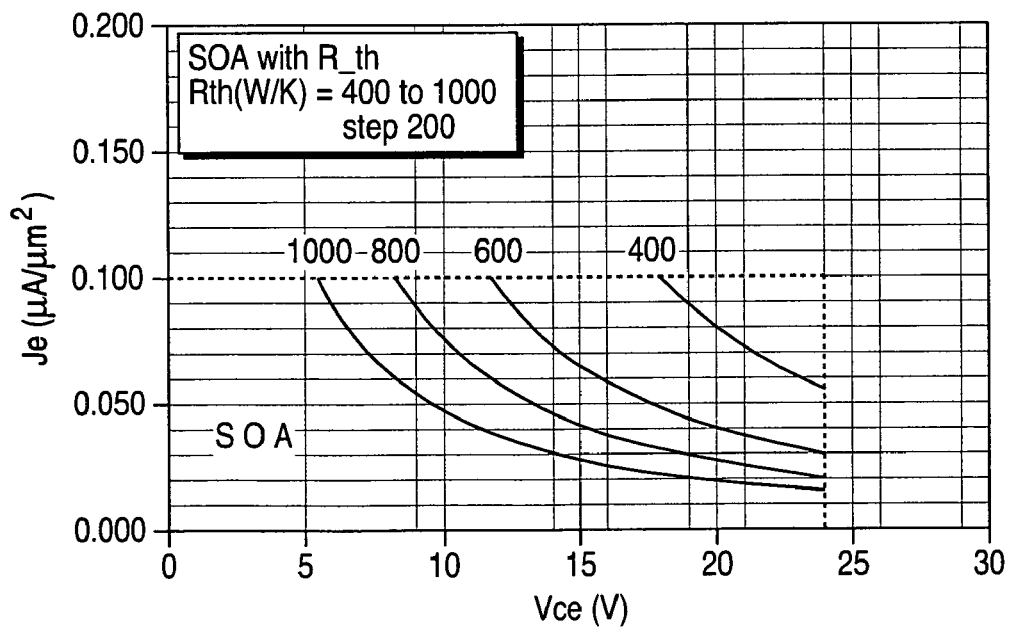
FIG. 15 shows VBIC simulations showing the improvement in SOA as a function of reducing the thermal resistance.
Figure 16A:
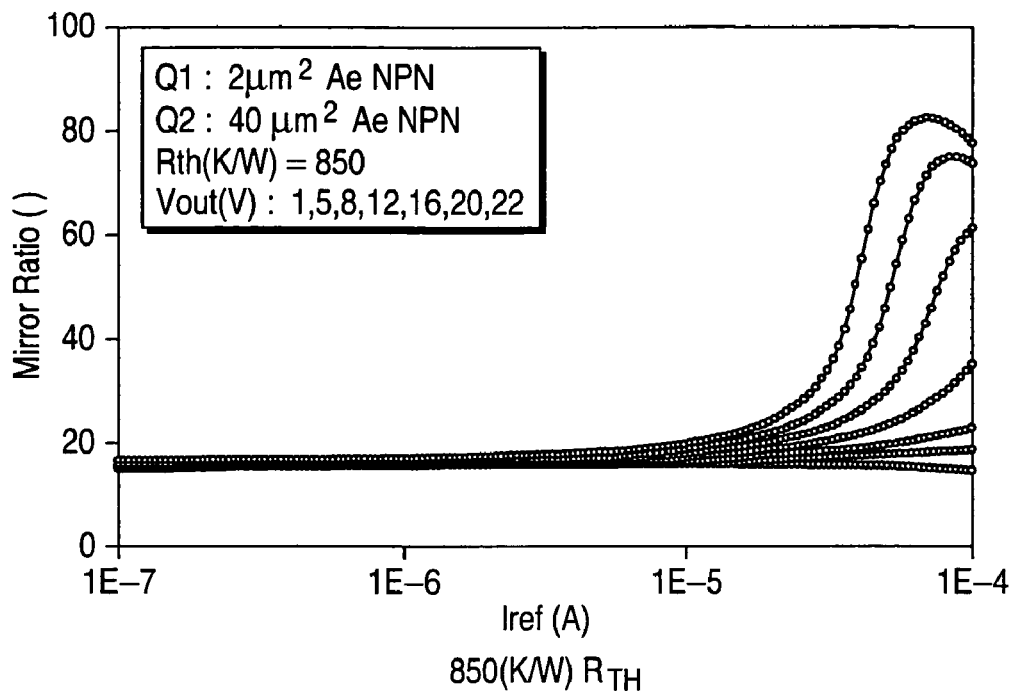
FIG. 16 is a graph showing the effect of reducing $R_{TH}$ to 400 K/W on the current mirror ratio.
Figure 16B:
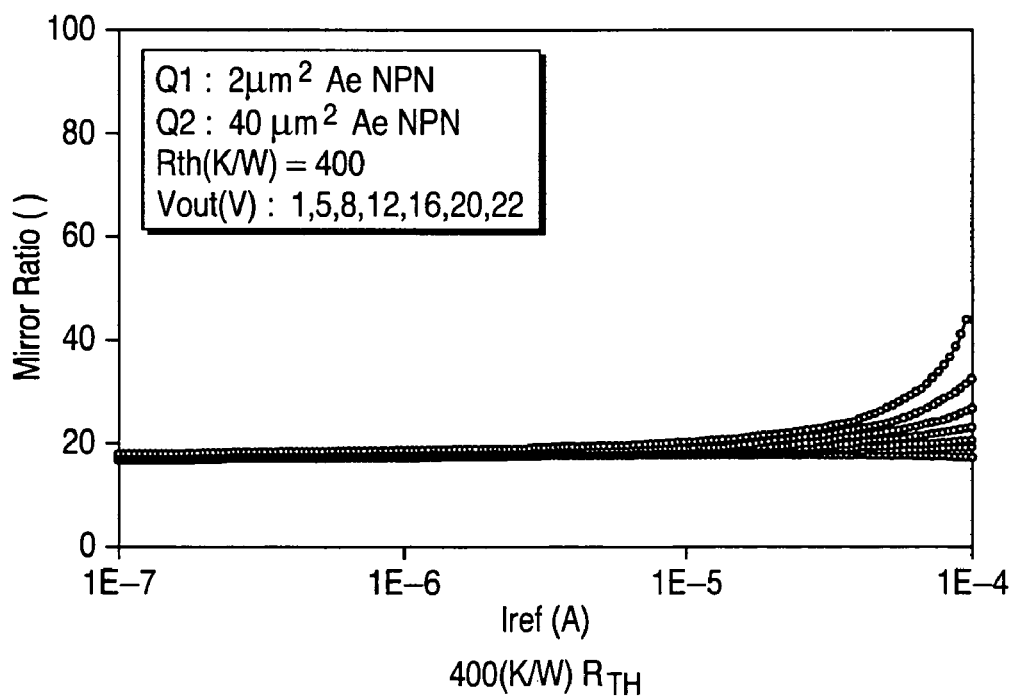

The simulations results provided in FIG. 15 show the effect of $R_{TH}$ on thermal instability at particular $V_{CE}$ FIG. 15 shows that it is difficult to totally eliminate self-heating effects in SOI BJTs at high $V_{CE}$ even when the thermal resistance is reduced to 400 K/W near that of bulk silicon. FIG. 16 shows current mirror measurement results for an $R_{TH}$ of 400 K/W and an optimized device layout and process. FIG. 16 shows that the mirror ratio remains proportional to the area ratio up to a $V_{CE}$ of 16 V.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of extracting thermal characteristics in a silicon-on-insulator (SOI) power bipolar junction transistor (BJT) formed in a semiconductor substrate, the method comprising:

providing a current mirror structure that includes a reference transistor and the power BJT;

measuring the current $I_{REF}$ flowing through the reference transistor;

measuring the current $I_{OUT}$ flowing through the power BJT;

determining a mirror ratio MR that is equal to $I_{OUT}/I_{REF}$; and utilizing the mirror ratio to determine the thermal characteristics, and wherein $$MR(MirrorRatio) \equiv \frac{I_{OUT}}{I_{REF}} \tag{1}$$

where $I_{REF} = \beta_1 \cdot I_{B1} + I_{B1} + I_{B2}$ and $I_{OUT} = \beta_2 \cdot I_{B2}$.

Assuming $\beta = \beta_1 = \beta_2$, the mirror ratio becomes $$MR = \frac{I_{B2}}{I_{B1}} \cdot \frac{\beta}{\beta + 1 + \frac{I_{B2}}{I_{B1}}}, \tag{2}$$

where $$\frac{I_{B2}}{I_{B1}} \approx AR \cdot \left(1 + \frac{\Delta T}{T}\right)^m \cdot \exp\left[\left(\frac{qV_{BE}}{kT}\right) \cdot \left(\frac{\frac{\Delta T}{T}}{1 + \frac{\Delta T}{T}}\right)\right]. \tag{3}$$

* * * * *